United States Patent [19]

Hörold et al.

[11] Patent Number: 5,880,247
[45] Date of Patent: Mar. 9, 1999

[54] PHOSPHORUS-CONTAINING DICARBOXYLIC ACID (ANHYDRIDE)-MODIFIED EPOXY RESIN

[75] Inventors: Sebastian Hörold, Erftstadt; Hans-Jerg Kleiner, Kronberg, both of Germany

[73] Assignee: Hoechst Aktiengesellschaft, Frankfurt, Germany

[21] Appl. No.: 827,436

[22] Filed: Mar. 27, 1997

[30] Foreign Application Priority Data

Apr. 1, 1996 [DE] Germany .................. 196 13 063.8

[51] Int. Cl.$^6$ ............................ C08G 59/14; C08L 63/02
[52] U.S. Cl. ...................... 528/108; 525/327.3; 525/423; 525/481; 525/508; 525/523; 525/533
[58] Field of Search .................. 528/108; 525/327.3, 525/423, 508, 523, 533, 481

[56] References Cited

U.S. PATENT DOCUMENTS

| 3,236,863 | 2/1966 | Smith et al. . | |
|---|---|---|---|
| 3,334,110 | 8/1967 | Schramm | 260/307 |
| 3,477,982 | 11/1969 | Dijkstra et al. | 260/37 |
| 4,127,590 | 11/1978 | Endo et al. | 260/346.74 |
| 4,289,812 | 9/1981 | Martin | 427/379 |
| 5,364,893 | 11/1994 | von Gentzkow et al. | 523/429 |

FOREIGN PATENT DOCUMENTS

| 2158361 | 9/1994 | Canada . | |
|---|---|---|---|
| 2141258 | 7/1995 | Canada . | |
| 2159177 | 4/1996 | Canada . | |
| 0384939 | 5/1990 | European Pat. Off. . | |
| 412425 | 2/1991 | European Pat. Off. . | |
| 0665237 | 8/1995 | European Pat. Off. . | |
| 665237 | 8/1995 | European Pat. Off. . | |
| 1745796 | 3/1972 | Germany . | |
| 2757733 | 7/1978 | Germany . | |
| 2920718 | 11/1979 | Germany . | |
| 3540524 | 5/1987 | Germany . | |
| 4308185 | 9/1994 | Germany . | |
| 4436079 | 4/1996 | Germany . | |
| 6-80765 | 3/1994 | Japan . | |
| 1222666 | 8/1965 | United Kingdom | 528/108 |
| 1031369 | 6/1966 | United Kingdom . | |

OTHER PUBLICATIONS

*Lackkunstharze*(Wagner/Sarx), 5th ed., Carl Hanser Verlag (1971), pp. 174–194.

Bald, G., et al, *Angewandte Makromol. Chem.* 44:151–163 (1975).

*Primary Examiner*—Robert E. Sellers
*Attorney, Agent, or Firm*—Miles B. Dearth

[57] ABSTRACT

The invention relates to a phosphorus-modified epoxy resin having an epoxide value of from 0.05 to 0.6 mol/100 g comprising structural units derived from (A) polyepoxide compounds having at least two epoxide groups per molecule and (B) phosphorus-containing dicarboxylic acids or phosphorus-containing carboxylic anhydrides, to a process for their preparation and to their use.

11 Claims, No Drawings

PHOSPHORUS-CONTAINING DICARBOXYLIC ACID (ANHYDRIDE)-MODIFIED EPOXY RESIN

The present invention relates to phosphorus-modified epoxy resins, to a process for their preparation and to their use. The resins are notable for their flame resistance and their good stability on storage.

Epoxy resins are nowadays employed to produce molding compositions and coatings having good thermal, mechanical and electronic properties. They are suitable for encapsulating electrical and electronic components and for soak and impregnation processes. In electrical engineering, the epoxy resin molding compositions used are predominantly treated for flame resistance.

Epoxy resin molding compositions are generally treated for flame resistance using bromine-containing aromatic compounds, especially tetrabromobisphenol A. If exclusively brominated flameproofing agents are employed, then a bromine content of about 20% is required in order to ensure that the molding compositions are self-extinguishing. As a synergist, antimony trioxide is used in many cases. In the event of fire, hydrogen bromide is given off, which can lead to corrosion damage. Under adverse conditions it is also possible for polybrominated dibenzodioxins and furans to be formed. There is therefore a need for epoxy resin molding compositions which achieve the required flame resistance without the addition of brominated compounds.

For the flame-resistant treatment of epoxy resin molding compositions, fillers having an extinguishing action, such as aluminum oxide hydrate (DE 35 40 524 Al), have been proposed. The addition of ammonium polyphosphate, alone or in combination with aluminum oxide hydrate, can also be used to achieve adequate flame resistance. Instead of ammoniumm polyphosphate, red phosphorus can also be used (DE 17 45 796 Al).

A disadvantage with all of the flameproofing agents present as a filler is that the materials obtained are not transparent. Numerous liquid organophosphorus compounds have already been proposed as flame-retarding plastics additives. A disadvantage with these systems, however, is the pronounced "plasticizer effect" of these additives. In the case of cured epoxy resins, the plasticizing effect is manifested in a sharp reduction in the glass transition temperature.

The flame-resistant treatment of epoxy resins with epoxide-functional phosphonic esters has already been described (DE 0 384 939 Al). A disadvantage with these systems is the high complexity of synthesizing such phosphonic esters. Also known in the literature are phosphorus-modified epoxy resins which are obtained by reacting polyepoxide compounds with anhydrides of phosphonic acids or phosphinic acids and which are notable for their flame resistance properties (DE 43 08 185 Al). Easier to obtain industrially than phosphonic anhydrides are phosphorus-containing dicarboxylic acids or phosphorus-containing carboxylic anhydrides, which are used, for example, for the flameproofing of polyester fibers (U.S. Pat. No. 4,127,590).

The object of the invention was to provide phosphorus-modified epoxy resins which are easy and inexpensive to prepare, have good stability on storage and allow for variation in the phosphorus content.

This object is achieved by a phosphorus-modified epoxy resin having an epoxide value of from 0.05 to 0.6 mol/100 g comprising structural units derived from (A) polyepoxide compounds having at least two epoxide groups per molecule and (B) phosphorus-containing dicarboxylic acids or phosphorus-containing carboxylic anhydrides.

The phosphorus-containing dicarboxylic acids or phosphorus-containing carboxylic anhydrides used in accordance with the invention are derived from the formulae (I) or (II):

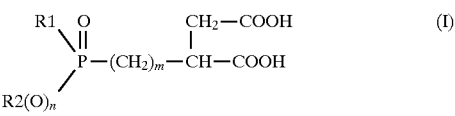

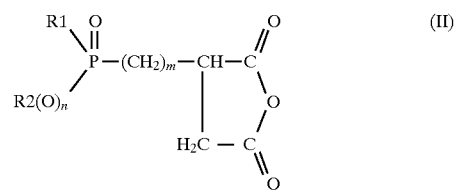

in which R1 and R2 are identical or different and are a straight-chain or branched alkyl radical of 1 to 8 carbon atoms, a cyclohexyl, cyclopentyl or aryl radical or an alkyl- or alkoxy-substituted aryl radical of 1 to 18 carbon atoms, in which R1 and R2, together with the P atom, may also form a ring, and m and n are 0 or 1.

The phosphorus-modified epoxy resin preferably comprises a phosphorus-containing dicarboxylic acid of the formula (III)

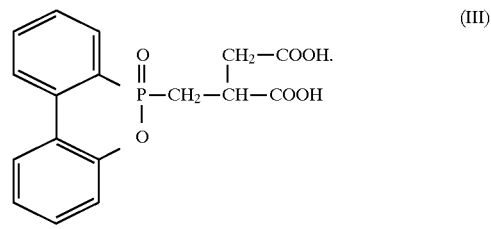

The phosphorus-modified epoxy resin preferably contains on average at least one epoxide group.

The phosphorus-modified epoxy resin preferably contains from 0.5 to 13% by weight, particularly preferably from 1 to 6% by weight, of phosphorus.

The present object is also achieved by a process for preparing phosphorus-modified epoxy resins from epoxy resins and phosphorus-containing compounds of formula (I) or (II), which comprises reacting the polyepoxide compound of (A) and the phosphorus-containing dicarboxylic acid or the phosphorus-containing carboxylic anhydride of (B) with one another.

The reaction preferably takes place in a solvent.

Preferred aprotic polar solvents employed are N-methylpyrrolidone, dimethylformamide, tetrahydrofuran, dioxane, dialkyl ethers, glycol ethers, ketones and/or esters.

Preferred solvents employed are halogenated hydrocarbons, aliphatic, cycloaliphatic and/or aromatic hydrocarbons, individually or as mixtures.

The reaction preferably takes place at temperatures of between −10° and +200° C.

The reaction particularly preferably takes place at temperatures from 70° to 160° C.

The ratio of equivalents between polyepoxide compound (A) and the phosphorus-containing dicarboxylic acid or the phosphorus-containing carboxylic anhydride (B) is preferably from 1:0.1 to 1:1.

The invention also relates to the use of the phosphorus-modified epoxy resin according to the invention, or obtained in accordance with the novel process, for producing moldings, coatings or laminates.

Finally, the invention relates to moldings, coatings or laminates produced using the phosphorus-modified epoxy resin.

The preparation of the phosphorus compounds can be carried out, as described in EP 665 237 Al, by reacting phosphine oxides with fumaric, maleic or itaconic esters and then hydrolyzing the esters with acids.

The halogen-free epoxide compounds employed in accordance with the invention (also referred to below as polyepoxide compounds) can be saturated or unsaturated and can be aliphatic, cycloaliphatic, aromatic and/or heterocyclic. They may, furthermore, include substituents which do not give rise, under the conditions of mixing or of reaction, to disruptive side reactions, examples being alkyl or aryl substituents, ether groups or the like. It is also possible to use mixtures of different polyepoxide compounds. The mean molecular weight $M_n$ of these polyepoxide compounds can be up to about 9000 but is generally from about 150 to 4000.

These polyepoxide compounds are, for example, polyglycidyl ethers based on polyhydric, preferably dihydric alcohols, phenols, hydrogenation products of these phenols and/or on novolaks (reaction products of mono- or polyhydric phenols, such as phenol and/or cresols, with aldehydes, especially formaldehyde in the presence of acidic catalysts), that are obtained in a known manner, for example by reacting the respective polyols with epichlorohydrin.

Examples of polyhydric phenols which may be mentioned here are: resorcinol, hydroquinone, 2,2-bis(4-hydroxyphenyl)propane (bisphenol A), isomer mixtures of dihydroxydiphenylmethane (bisphenol F), 4,4'-dihydroxydiphenylcyclohexane, 4,4'-dihydroxy-3,3'-dimethyldiphenylpropane, 4,4'-dihydroxybiphenyl, 4,4'-dihydroxybenzophenone, 1,1-bis (4-hydroxyphenyl)ethane, 1,1'-bis (4-hydroxyphenyl)isobutane, 2,2-bis(4-hydroxy-tert-butylphenyl)propane, bis(2-hydroxynaphthyl)methane, 1,5-dihydroxy-naphthalene, tris(4-hydroxyphenyl)methane, 1,1'-bis(4-hydroxyphenyl) ether. Bisphenol A and bisphenol F are preferred in this context.

Also suitable as polyepoxide compound are the polyglycidyl ethers of polyhydric aliphatic alcohols. Examples of such polyhydric alcohols that may be mentioned are 1,4-butanediol, 1,6-hexanediol, polyalkylene glycols, glycerol, trimethylolpropane, 2,2-bis(4-hydroxycyclohexyl)propane and pentaerythritol.

Further suitable polyepoxide compounds are (poly) glycidyl esters, which are obtained by reacting epichlorohydrin or similar epoxy compounds with an aliphatic, cycloaliphatic or aromatic polycarboxylic acid such as oxalic acid, adipic acid, glutaric acid, phthalic, isophthalic, terephthalic, tetrahydrophthalic or hexahydrophthalic acid, 2,6-naphthalenedicarboxylic acid and dimerized fatty acids. Examples thereof are diglycidyl terephthalate and diglycidyl hexahydrophthalate.

Polyepoxide compounds which comprise the epoxide groups in random distribution along the molecule chain and which can be prepared by emulsion copolymerization using olefinically unsaturated compounds containing these epoxide groups, for example glycidyl esters of acrylic or methacrylic acid, can also be employed with advantage in some cases.

Examples of further polyepoxide compounds which can be used are those based on heterocyclic ring systems, such as, for example, hydantoin epoxy resins, triglycidyl isocyanurate and/or its oligomers, triglycidyl p-aminophenol, triglycidyl p-aminophenyl ether, tetraglycidyldiaminodiphenylmethane, tetraglycidyldiaminodiphenyl ether, tetrakis(4-glycidyloxyphenyl)ethane, urazole epoxides, uracil epoxides, and oxazolidinone-modified epoxy resins. Other examples are polyepoxides based on aromatic amines, such as aniline, for example N,N-diglycidylaniline, diaminodiphenylmethane and N,N'-dimethylaminodiphenylmethane or N,N'-dimethylaminodiphenyl sulfone. Further suitable polyepoxide compounds are described in the "Handbook of Epoxy Resins" by Henry Lee and Kris Neville, McGraw-Hill Book Company, 1967, in the monograph by Henry Lee "Epoxy Resins", American Chemical Society, 1970, in Wagner/Sarx, "Lackkunstharze", Carl Hanser Verlag (1971), 5th edition, 174 ff., in "Angew. Makromol. Chemie", Vol. 44 (1975), pages 151 to 163, in DE 27 57 733 Al and in EP 0 384 939 Al, which are incorporated by reference.

Polyepoxide compounds that are employed with preference are bisglycidyl ethers based on bisphenol A, bisphenol F and bisphenol S (reaction products of these bisphenols and epichloro(halo)hydrin) or oligomers thereof, polyglycidyl ethers of phenol-formaldehyde and/or cresol-formaldehyde novolaks, and diglycidyl esters of phthalic, isophthalic, terephthalic, tetrahydrophthalic and/or hexahydrophthalic acid and of trimellitic acid, N-glycidyl compounds of aromatic amines and heterocyclic nitrogen bases, such as N,N-diglycidylaniline, N,N,O-triglycidyl-p-aminophenol, triglycidyl isocyanurate and N,N,N',N'-tetraglycidylbis(p-aminophenyl)methane, hydantoin epoxy resins and aracid epoxy resins, and also di- and polyglycidyl compounds of polyhydric aliphatic alcohols such as 1,4-butanediol, trimethylolpropane and polyalkylene glycols.

In addition, oxazolidinone-modified epoxy resins are also suitable. Such compounds are already known (see: "Angew. Makromol. Chem.", Vol 44 (1975), pages 151 to 163, and also U.S. Pat. No. 3,334,110); an example thereof which may be mentioned is the reaction product of bisphenol A diglycidyl ether with diphenylmethane diisocyanate (in the presence of an appropriate accelerator). In connection with the preparation of the novel coating composition, the polyepoxy resins can be present individually or in a mixture.

The term "curing" as used herein denotes the conversion of the soluble, meltable polyepoxides to solid, insoluble and infusible, three-dimensionally crosslinked products, generally with simultaneous shaping, to give, for instance, impregnated structures, coatings and adhesive bonds.

Hardeners (curing agents) which can be used are, for example, aliphatic, cycloaliphatic, aromatic and heterocyclic amines, such as bis(4-aminophenyl)methane, aniline-formaldehyde resins, bis(4-aminophenyl) sulfone, ethylenediamine, 1,3-propanediamine, hexamethylenediamine, diethylenetriamine, triethylenetetramine, 2,2,4-trimethyl-1,6-hexanediamine, m-xylylenediamine, bis(4-aminocyclohexyl)methane, 2,2-bis(4-aminocyclohexyl)propane, 3-aminomethyl-3,5,5-trimethylcyclohexylamine (isophoronediamine), polyamidoamines, polyphenols, such as hydroquinone, resorcinol, 2,2-bis(4-hydroxyphenyl)propane (bisphenol A) and phenol-aldehyde resins, polycarboxylic acids and their anhydrides, for example phthalic anhydride, tetrahydrophthalic anhydride, hexahydrophthalic anhydride, and pyromellitic dianhydride. Over and above this it is also possible to use catalytic curing agents, such as cyanoguanidines, or Friedel-Crafts catalysts, such as boron trifluoride.

If amines are used as curing agents, then they are normally employed in an amount of from 0.75 to 1.25 equivalents per epoxide equivalent. In the case of polycarboxylic acids or their anhydrides, from 0.4 to 1.1 equivalents are used per epoxide equivalent.

Suitable accelerators are principally imidazole derivatives, for example 2-methylimidazole, 2-phenylimidazole and 2-heptadecylimidazole; also suitable are phosphines, metal soaps and acetylacetonates.

Examples of suitable reactive diluents are mono- or polyfunctional alcohols of low molecular mass which are reacted with epichlorohydrin.

By varying the ratio of equivalents of polyepoxide compound to phosphorus-containing dicarboxylic acids or phosphorus-containing carboxylic anhydrides it is possible to adjust the phosphorus content of the novel resin. The ratio of equivalents is preferably between 1:0.1 and 1:0.8 and, with particular preference, between 1:0.1 and 1:0.4. The reaction of the epoxy resin with a phosphorus-containing dicarboxylic acid or a phosphorus-containing carboxylic anhydride gives a still meltable and/or soluble, phosphorus-modified epoxy resin which is stable on storage, optionally even in solution, and is easy to handle.

If solvents are employed, they are aprotic and preferably polar. Examples of such are:

N-methylpyrrolidone, dimethylformamide, ethers, such as diethyl ether, tetrahydrofuran, dioxane, ethylglycol ethers, propylene glycol ethers, butylglycol ethers of monoalcohols having an optionally branched alkyl radical of 1 to 6 carbon atoms.

Examples of other solvents are ketones, for example acetone, methyl ethyl ketone, methyl isopropyl ketone, methyl isobutyl ketone, cyclohexanone and the like, although esters, such as ethyl acetate, butyl acetate, ethylene glycol acetate and methoxypropyl acetate, can also be employed.

Other suitable solvents are halogenated hydrocarbons and also cycloaliphatic and/or aromatic hydrocarbons; among which preference is given to hexane, heptane, cyclohexane, toluene and dixylenes. It is possible to employ these solvents individually or in a mixture.

The epoxy resin molding compositions are preferably reinforced by means of glass cloth or glass fibers. The epoxy resin molding compositions can also be equipped with fillers such as quartz flour or aluminum oxide hydrate.

The novel epoxy resin molding compositions can be used for surface coatings. They can be used for encapsulating electrical components, for laminates and for adhesives.

The invention is illustrated below by means of examples. In Examples 1–4, a phosphorus compound of formula (III) was used:

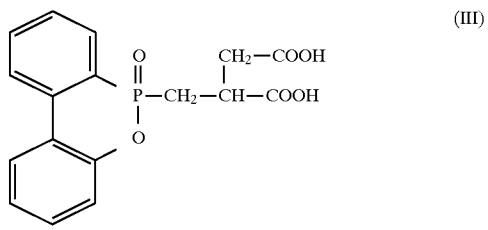

(III)

Preparation of the phosphorus-modified epoxy resins

EXAMPLE 1

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 46.9 g (0.135 mol) of the phosphorus compound of formula (III) are heated with stirring to not more than 150° C. After 30 minutes, a clear melt has formed. After stirring at 150° C. for one hour more the melt is allowed to cool and is subjected to the action of a mortar. 146 g of a white powder are obtained, having an epoxide value of 0.18 mol/100 g and a phosphorus content of 2.85% by weight.

EXAMPLE 2

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 64.3 g (0.19 mol) of the phosphorus compound of formula (III) are heated with stirring to not more than 150° C. After 30 minutes, a clear melt has formed. After stirring at 150° C. for one hour more the melt is allowed to cool and is subjected to the action of a mortar. 164 g of a white powder are obtained, having an epoxide value of 0.13 mol/100 g and a phosphorus content of 3.47% by weight.

EXAMPLE 3

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 46.9 g (0.135 mol) of the phosphorus compound of formula (III) are heated with stirring to not more than 130° C. 40 ml of isobutyl ethyl ketone are added over the course of 2.5 h. The clear solution is then stirred at 120° C. for 1 h more. 177 g of a viscous solution (83% strength) are obtained, having an epoxide value of 0.17 mol/100 g and a phosphorus content of 2.37% by weight.

EXAMPLE 4

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 46.9 g (0.135 mol) of the phosphorus compound of formula (III) are heated with stirring to not more than 150° C. While the homogeneous reaction mixture is being cooled, 36.7 g of methyl ethyl ketone are added. 195 g of a viscous solution (75% strength) are obtained, having an epoxide value of 0.11 mol/100 g and a phosphorus content of 2.15% by weight.

EXAMPLE 5

(with dimethylphosphinylmethylsuccinic acid (IV))

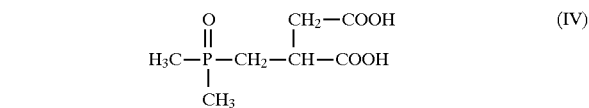

(IV)

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 29 g (0.135 mol) of the phosphorus compound of formula (IV) are stirred at 120° C. for 90 minutes and at 140° C. for 30 minutes. The clear melt is cooled and then subjected to the action of a mortar. 129 g of a white powder are obtained, having an epoxide value of 0.19 mol/kg and a phosphorus content of 3.3% by weight.

EXAMPLE 6
(with diphenylphosphinylmethylsuccinic acid (V))

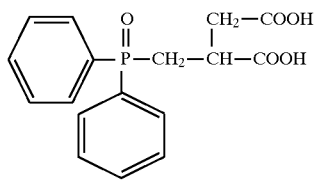

In a 250 ml five-necked flask fitted with reflux condenser, stirrer shaft, thermometer and gas inlet, 100 g of a bisphenol A bisglycidyl ether having an epoxide value of 0.55 mol/100 g (®Beckopox EP 140, Hoechst AG) and 43 g (0.135 mol) of the phosphorus compound of formula (V) are stirred at 120° C. for 90 minutes and at 140° C. for 30 minutes. The clear melt is cooled and then subjected to the action of a mortar. 129 g of a white powder are obtained, having an epoxide value of 0.19 mol/kg and a phosphorus content of 2.8% by weight.

We claim:

1. A phosphorus-modified epoxy resin having an epoxide value of from 0.05 to 0.6 mol/100 g comprising structural units derived from
   (A) 1.0 equivalents of polyepoxide compounds having at least two epoxide groups per molecule and
   (B) from 0.1 to 0.4 equivalents of phosphorus-containing dicarboxylic acids or phosphorus-containing carboxylic anhydrides, having the formula (I) or (II)

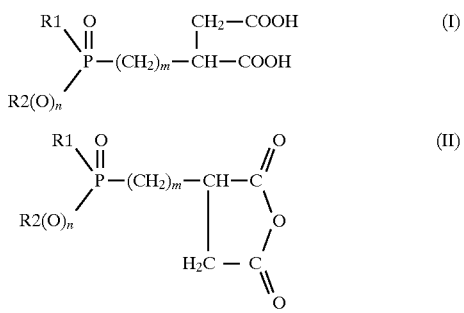

in which R1 and R2 are identical or different and are a straight-chain or branched alkyl radical of 1 to 8 carbon atoms, a cyclohexyl, cyclopentyl or aryl radical or an alkyl- or alkoxy-substituted aryl radical of 1 to 8 carbon atoms, in which R1 and R2, together with the P atom, may also form a ring, and m and n are 0 or 1.

2. A phosphorus-modified epoxy resin as claimed in claim 1, which comprises a phosphorus-containing dicarboxylic acid of the formula (III)

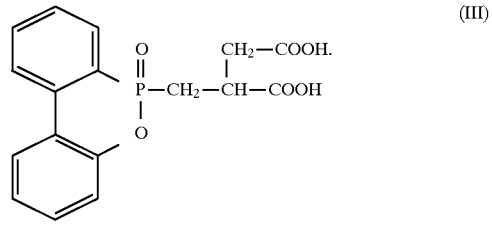

3. A phosphorus-modified epoxy resin as claimed in claim 1, which contains on average at least one epoxide group.

4. A phosphorus-modified epoxy resin as claimed in claim 1, which contains from 0.5 to 13% by weight of phosphorus.

5. A process for preparing a phosphorus-modified epoxy resin as claimed in claim 1, which comprises reacting the polyepoxide compound of (A) and the phosphorus-containing dicarboxylic acid or the phosphorus-containing carboxylic anhydride of (B) with one another.

6. The process as claimed in claim 5, wherein the reaction takes place in a solvent.

7. The process as claimed in claim 6, wherein the solvent is an aprotic polar solvent selected from the group consisting of N-methylpyrrolidone, dimethylformamide, tetrahydrofuran, dioxane, a dialkyl ether, a glycol ether, a ketone and a ketone ester.

8. The process as claimed in claim 6, wherein the solvent is selected from the group consisting of halogenated hydrocarbons, aliphatic hydrocarbons, cycloaliphatic hydrocarbons, aromatic hydrocarbons, and mixtures thereof.

9. The process as claimed in claim 4, wherein the reaction takes place at temperatures of between −10° and +200° C.

10. The process as claimed in claim 9, wherein the reaction takes place at temperatures from 70° to 160° C.

11. A molding, coating or laminate produced using the phosphorus-modified epoxy resin as claimed in claim 1 or obtained as claimed in claim 5.

* * * * *